(12) United States Patent
Taskin et al.

(10) Patent No.: US 11,243,559 B2
(45) Date of Patent: Feb. 8, 2022

(54) FLEXIBLE ON-CHIP POWER AND CLOCK

(71) Applicants: Drexel University, Philadelphia, PA (US); University of South Florida, Tampa, FL (US)

(72) Inventors: Baris Taskin, Philadelphia, PA (US); Ragh Kuttappa, Philadelphia, PA (US); Selcuk Kose, Tampa, FL (US)

(73) Assignee: Drexel University, Philadelphia, PA (US)

( * ) Notice: Subject to any disclaimer, the term of this patent is extended or adjusted under 35 U.S.C. 154(b) by 0 days.

(21) Appl. No.: 16/887,056

(22) Filed: May 29, 2020

(65) Prior Publication Data
US 2021/0034094 A1 Feb. 4, 2021

Related U.S. Application Data

(60) Provisional application No. 62/853,737, filed on May 29, 2019.

(51) Int. Cl.
*G05F 1/10* (2006.01)
*G06F 1/10* (2006.01)
(Continued)

(52) U.S. Cl.
CPC .............. *G06F 1/10* (2013.01); *G05F 1/10* (2013.01); *H01L 23/66* (2013.01); *H03K 3/012* (2013.01); *H03K 3/0315* (2013.01)

(58) Field of Classification Search
CPC ... G05F 1/10; G05F 1/46; G05F 1/462; G05F 1/465; G05F 1/56; G05F 1/59; G05F 3/02; G05F 3/08; G06F 1/10; G06F 1/26; G06F 1/32; G06F 1/3203; G06F 1/3234; G06F 1/324; G06F 1/3296; H01L 23/66; H02M 3/07; H02M 3/156; H02M 3/18; H03K 3/012; H03K 3/0315; H03K 3/0322

See application file for complete search history.

(56) References Cited

U.S. PATENT DOCUMENTS 5,754,482 A * 5/1998 Su ..................... G11C 7/12
365/189.07
7,218,180 B2 * 5/2007 Wood ................... H03B 5/1852
331/107 DP (Continued)

OTHER PUBLICATIONS

Slip, "Distributed Digital Low-Dropout Regulators with Phase Interleaving for On-Chip Voltage Noise Mitigation", Jun. 2, 2019, Las Vegas, NV, 5 pages.

(Continued)

*Primary Examiner* — Levi Gannon
(74) *Attorney, Agent, or Firm* — Schott, P.C.

(57) ABSTRACT

Modern integrated circuits have an increasing need for various levels of both supply voltage (V) and operating frequency (f) available at fine spatial and temporal granularity. This work introduces a solution that provides a number and quality of locally distributed V/f domains through FOPAC. Opportunistically sharing design resources and features between multi-phase voltage regulators (MPVRs) and resonant rotary clocks (ReRoCs) enabling i) the scalability to hundreds of domains, ii) fast switching times for both voltage and frequency, leading to temporal flexibility, and iii) locally distributed designs, leading to spatial flexibility.

12 Claims, 12 Drawing Sheets

(51) Int. Cl.
*H03K 3/03* (2006.01)
*H01L 23/66* (2006.01)
*H03K 3/012* (2006.01)

(56) References Cited

U.S. PATENT DOCUMENTS

| | | | | |
|---|---|---|---|---|
| 8,089,322 | B2* | 1/2012 | Beccue | H03B 5/1852 |
| | | | | 331/96 |
| 2001/0038279 | A1* | 11/2001 | Jaworski | H02M 3/07 |
| | | | | 323/288 |
| 2005/0010883 | A1* | 1/2005 | Wood | G06F 30/367 |
| | | | | 716/113 |
| 2009/0001953 | A1* | 1/2009 | Huang | G05F 1/575 |
| | | | | 323/281 |
| 2014/0071721 | A1* | 3/2014 | Verma | H02M 3/07 |
| | | | | 363/59 |
| 2015/0028839 | A1* | 1/2015 | Petrovic | H02M 3/07 |
| | | | | 323/311 |
| 2016/0099708 | A1* | 4/2016 | Taskin | H03K 21/10 |
| | | | | 331/57 |
| 2017/0047892 | A1* | 2/2017 | Taskin | H03K 21/10 |
| 2017/0207697 | A1* | 7/2017 | Heo | G06F 1/3243 |

OTHER PUBLICATIONS

Kuttappa et al., "FOPAC: Flexible On-Chip Power and Clock" IEEE Transactions on Circuits and Systems I: vol. 66, Issue 12, Dec. 2019, 6 pages.

* cited by examiner

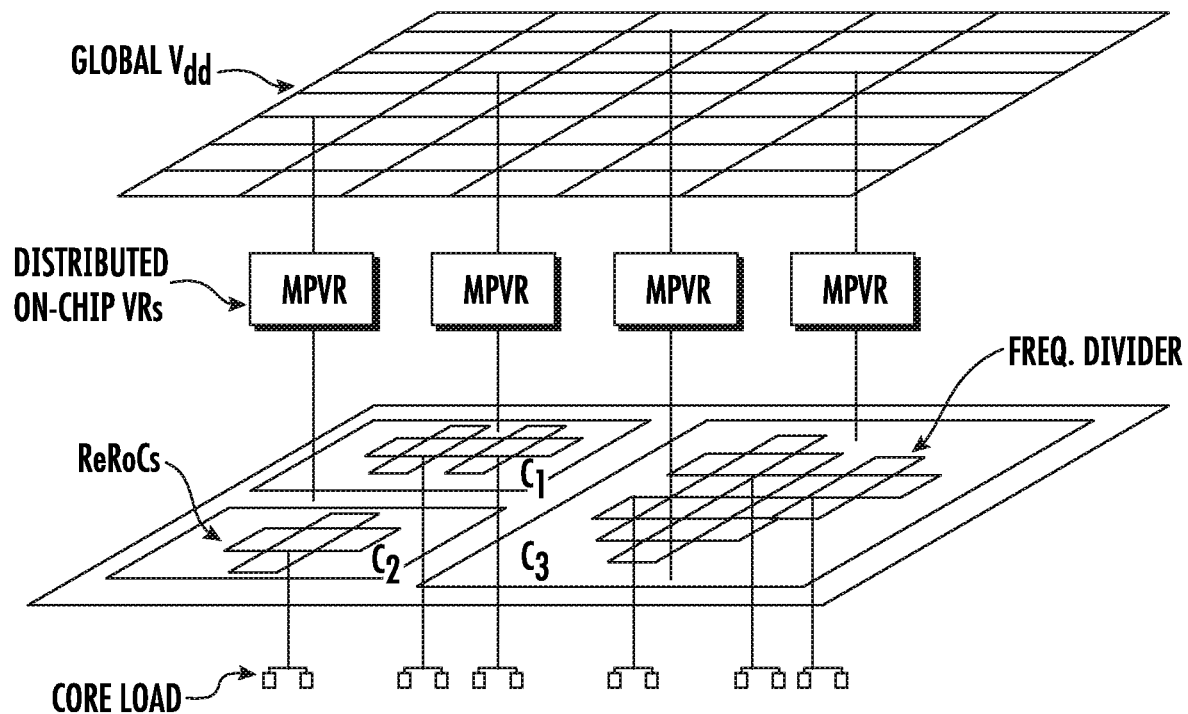
FIG. 1.1
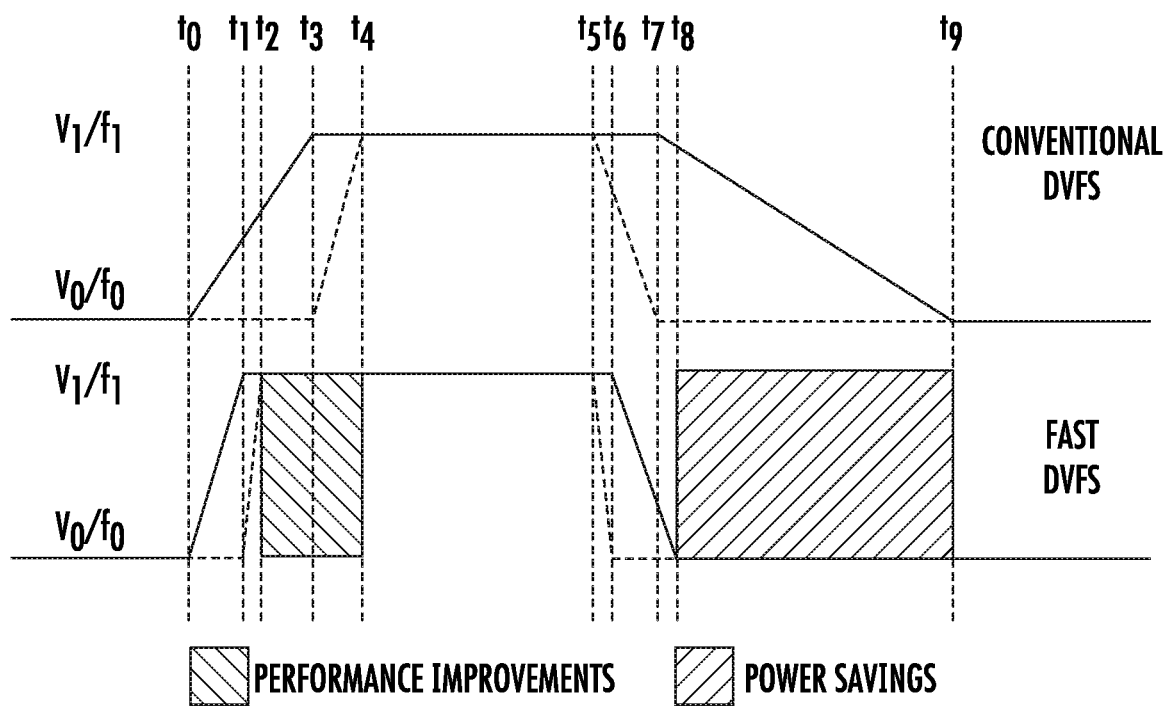
FIG. 1.2

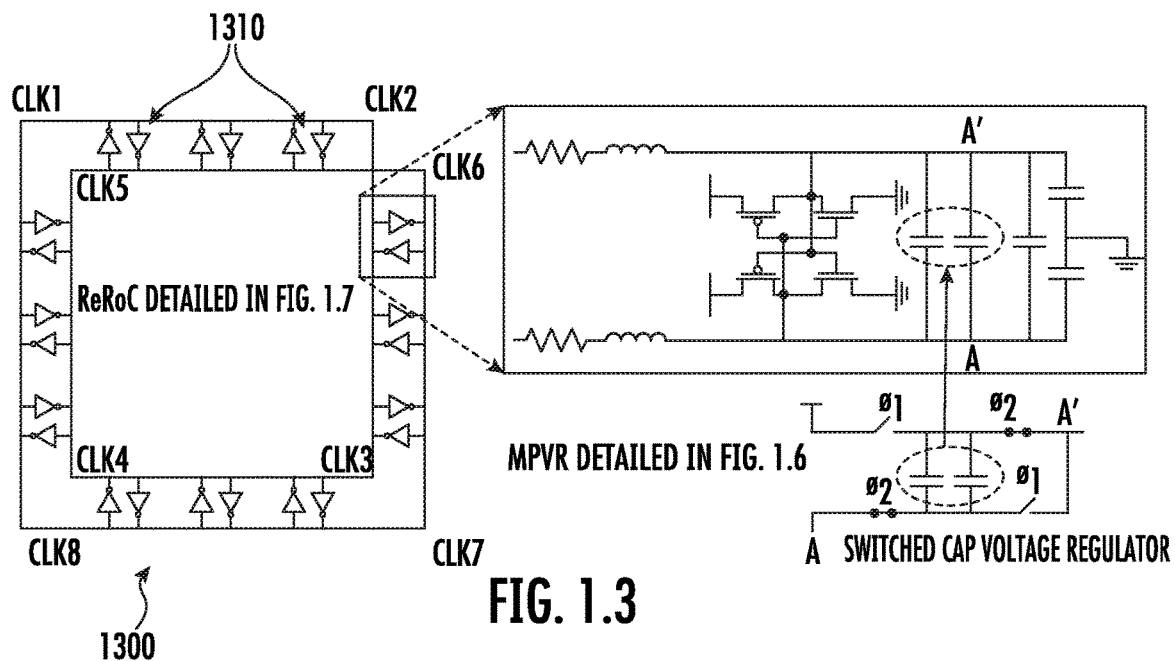
FIG. 1.3
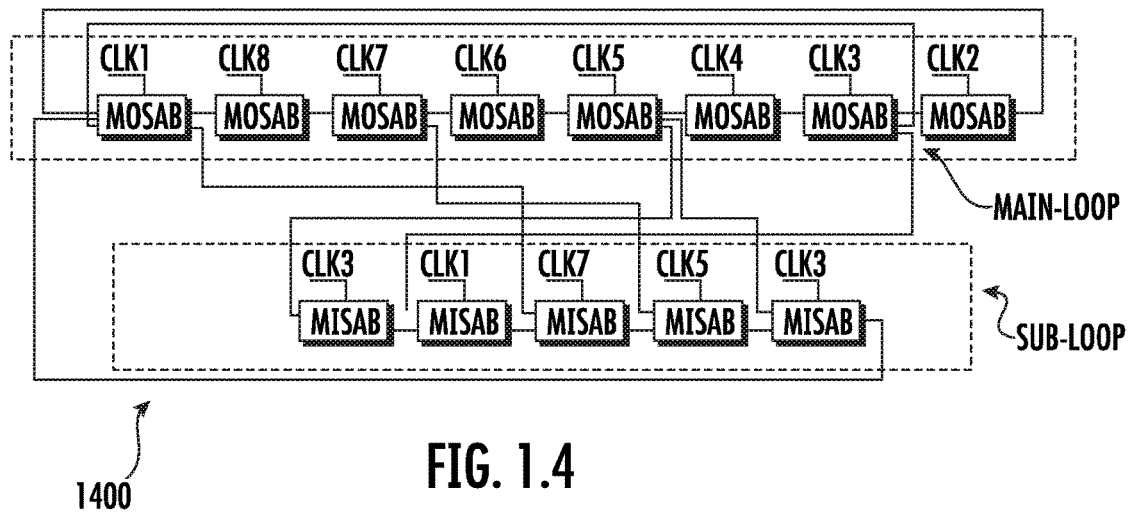
FIG. 1.4

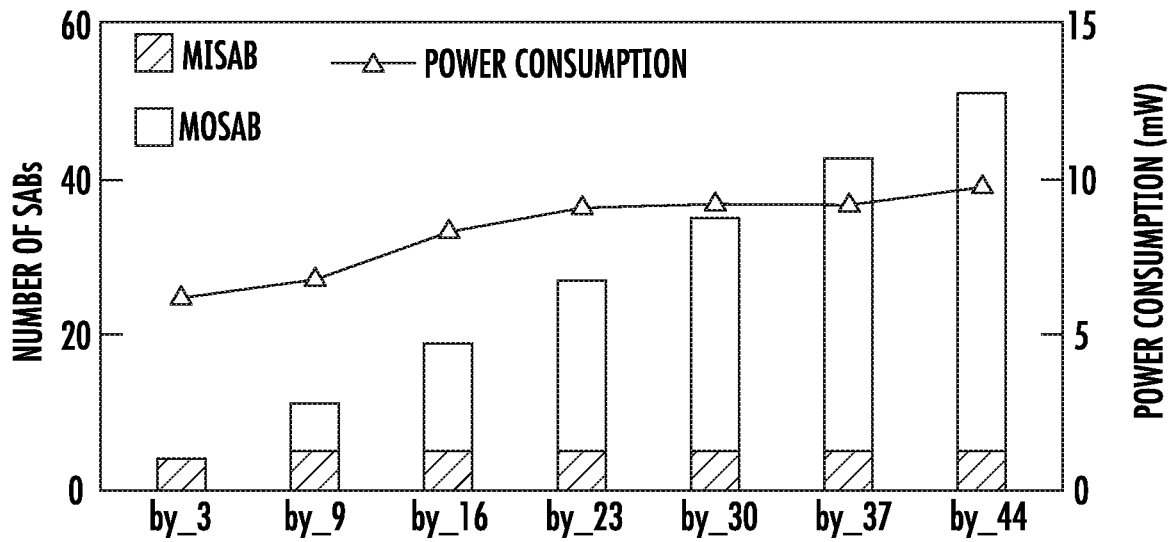
FIG. 1.5
| DIV RATIO | MASTER CLOCK 2.5 GHz | | MASTER CLOCK 4.2 GHz | | MASTER CLOCK 5 GHz | |
|---|---|---|---|---|---|---|
| | PWR. (mW) | DFS TIME (ns) | PWR. (mW) | DFS TIME (ns) | PWR. (mW) | DFS TIME (ns) |
| 3 | 7.32 | 1.18 | 5.20 | 0.72 | 4.31 | 0.59 |
| 9 | 7.90 | 1.19 | 5.78 | 0.69 | 4.89 | 0.60 |
| 16 | 9.43 | 1.19 | 7.31 | 0.71 | 6.42 | 0.61 |
| 23 | 10.18 | 1.21 | 8.07 | 0.70 | 7.18 | 0.60 |
| 30 | 10.32 | 1.20 | 8.20 | 0.71 | 7.31 | 0.60 |
| 37 | 10.27 | 1.19 | 8.15 | 0.72 | 7.26 | 0.60 |
| 44 | 10.87 | 1.19 | 8.74 | 0.68 | 7.86 | 0.59 |
| AVG. | 9.47 | 1.19 | 7.35 | 0.70 | 6.46 | 0.60 |
FIG. 1.5.1

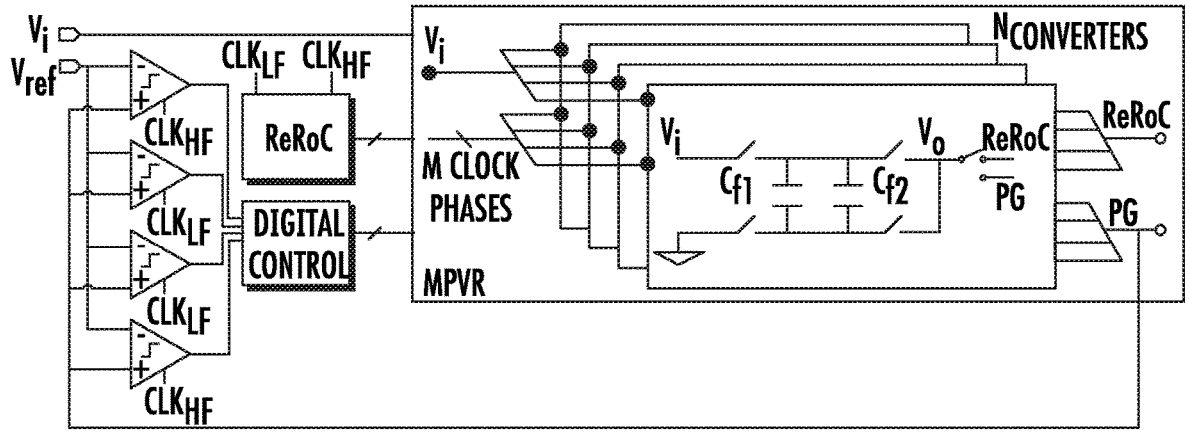
FIG. 1.6 (A)
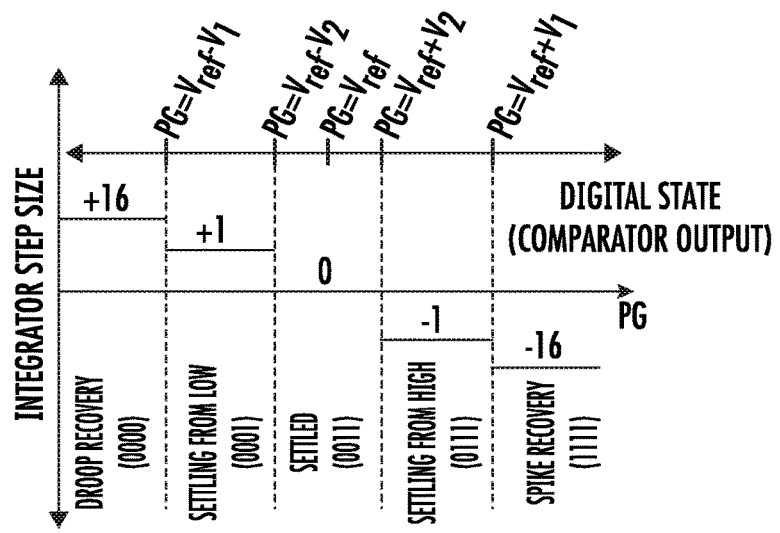
FIG. 1.6 (B)

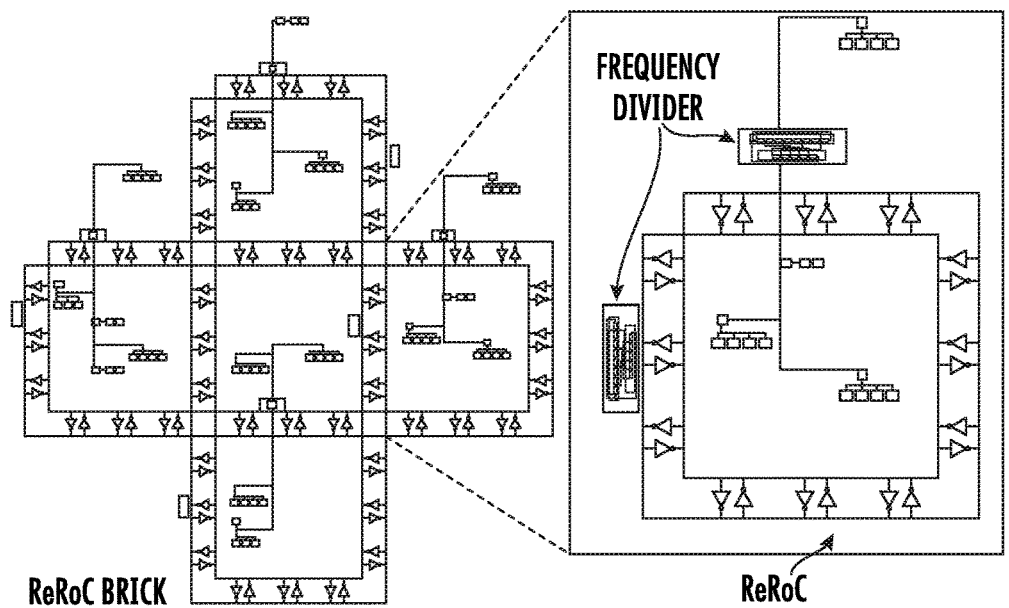
FIG. 1.7
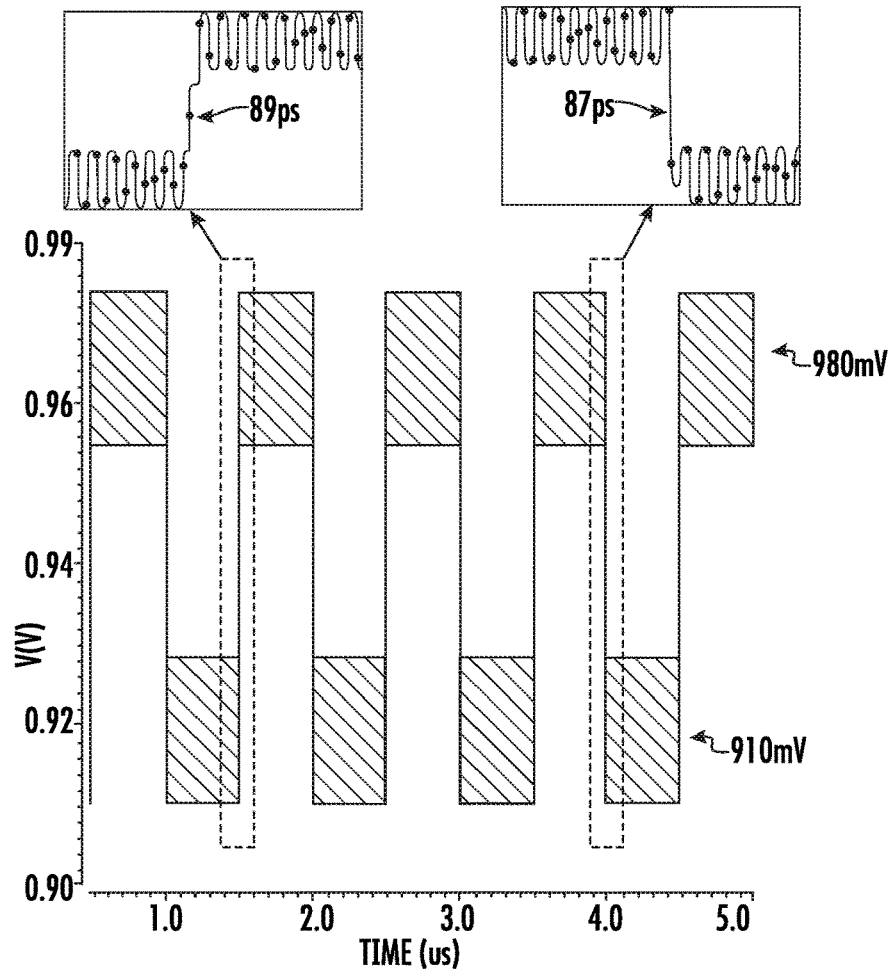
FIG. 1.8

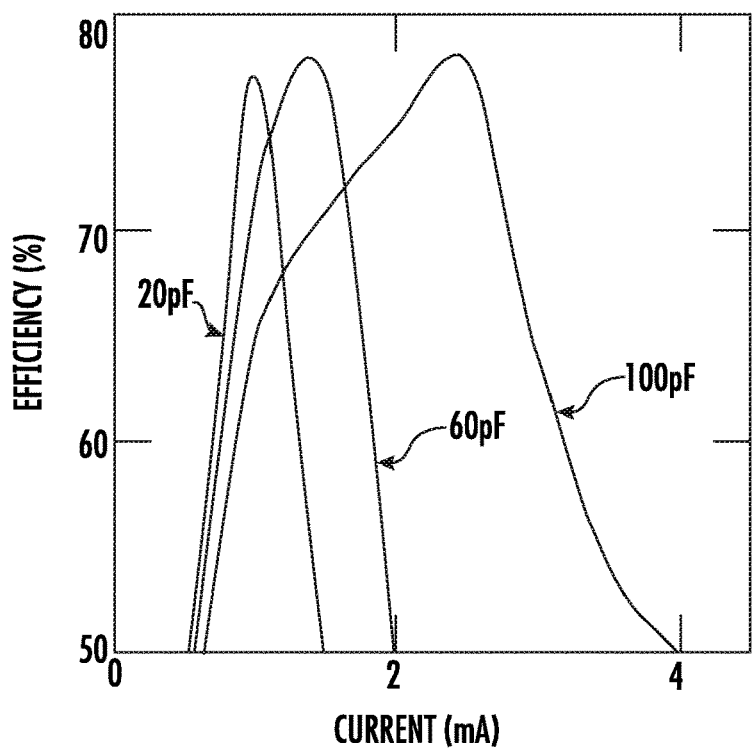
FIG. 1.9(A)
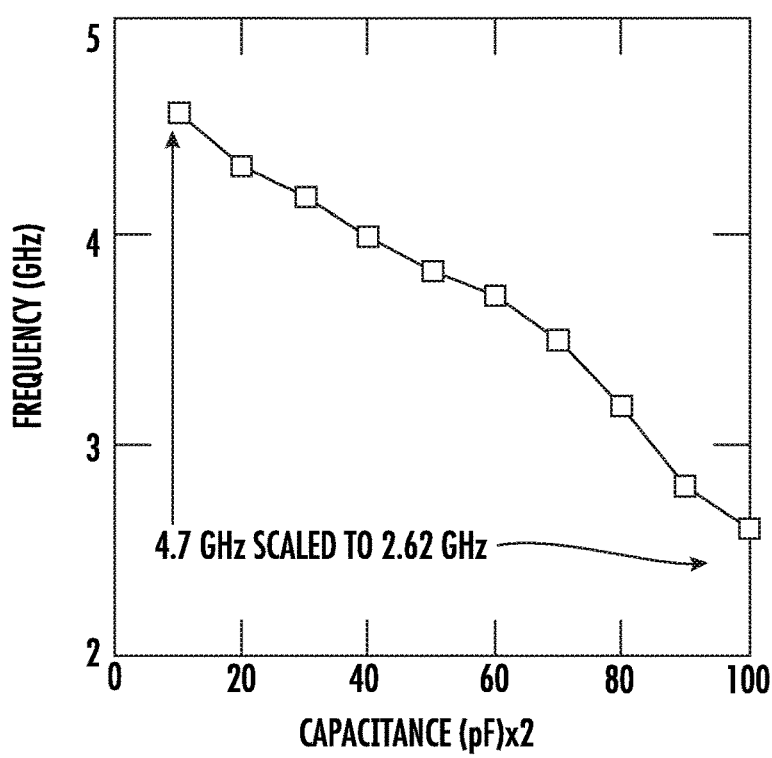
FIG. 1.9(B)

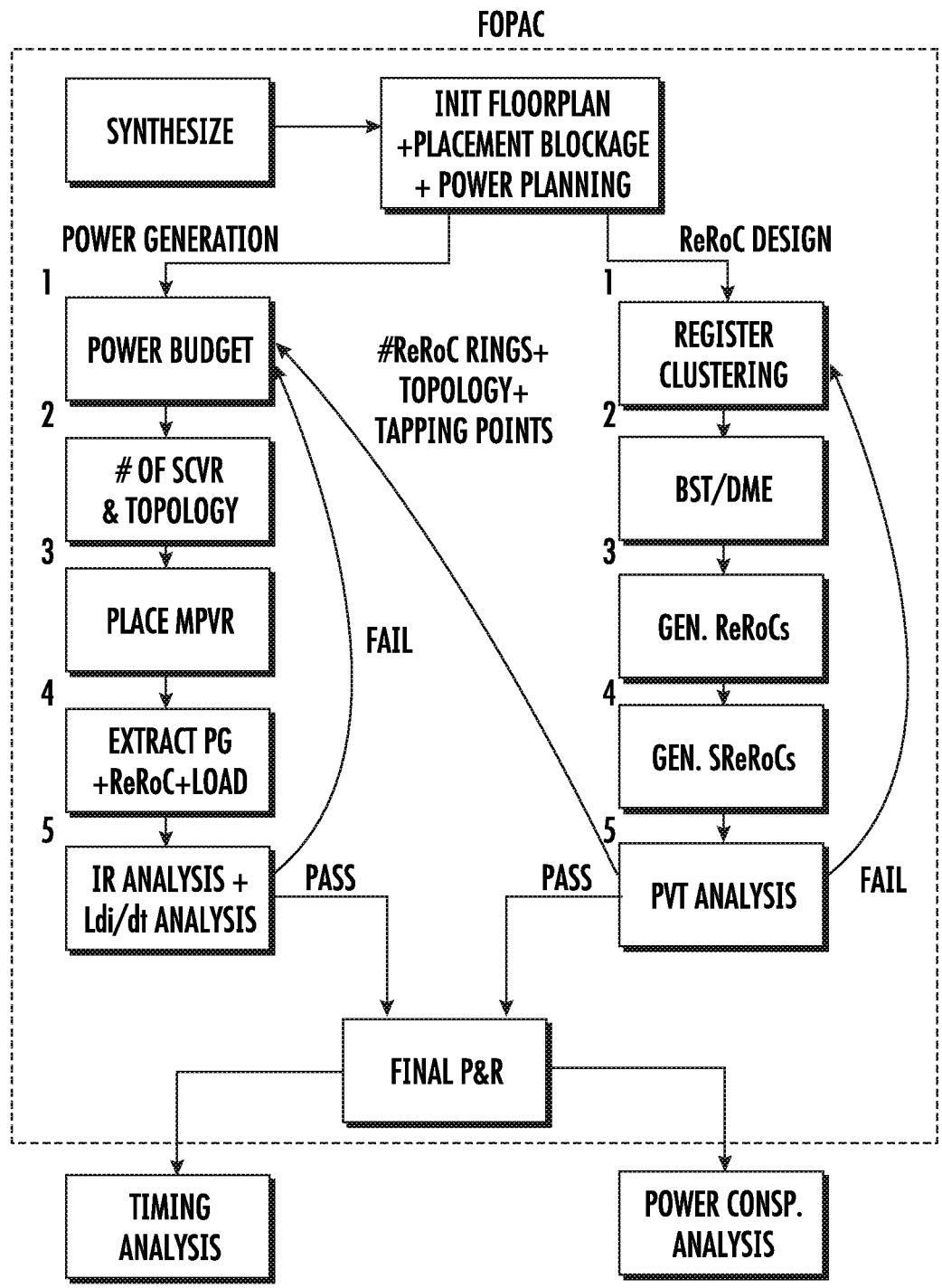
FIG. 1.10

| DESIGN | PVT (500 MONTE-CARLO RUNS) | | STATIC IR & Ldi/dt |
|---|---|---|---|
| | MAX. INTRA-DIE | MAX. INTER-DIE | |
| AES CIPHER | 31 MHz | 15 MHz | 2.1 % |
| CORTEX M0 | 35 MHz | 17 MHz | 1.9% |
| VSCALE RISC-V | 28 MHz | 24 MHz | 2.4% |
| AVERAGE | 30 MHz | 19 MHz | 2.1% |
FIG. 1.10.2
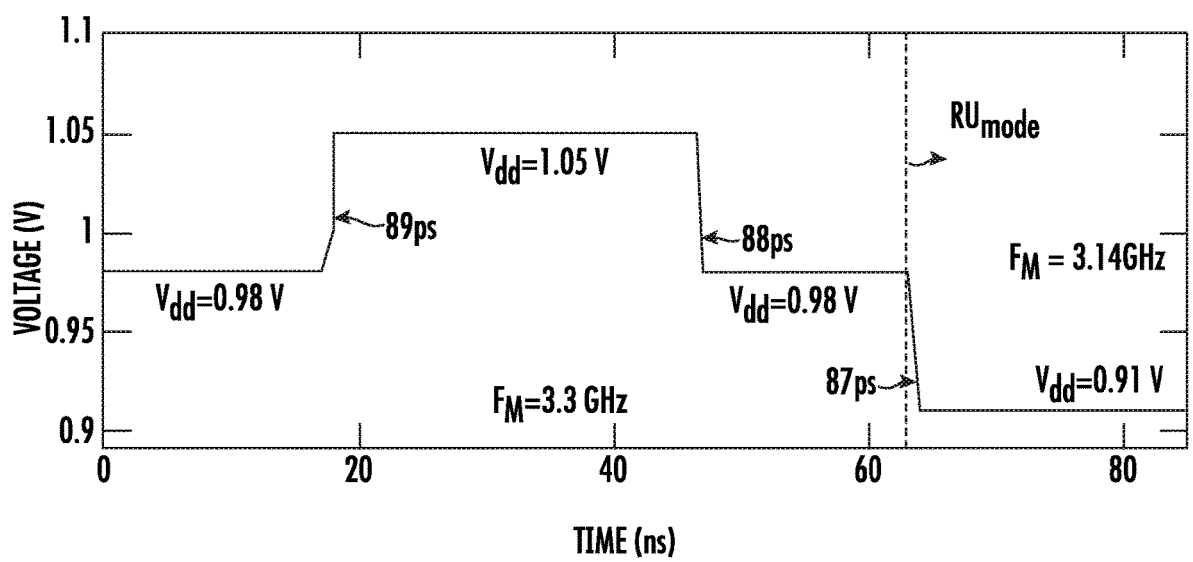
FIG. 1.11(A)

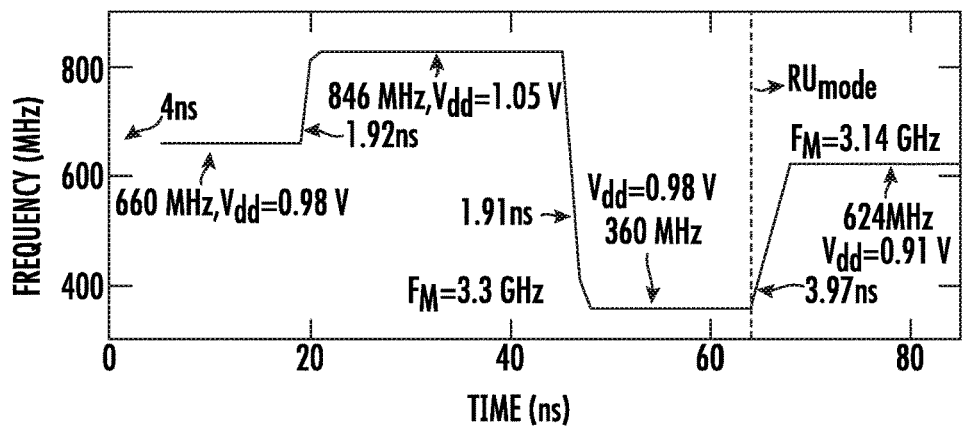

FIG. 1.11(B)

| DESIGN | #SCVRs | PLL CLOCKED DESIGN | | FOPAC | | #ReRoC |
|---|---|---|---|---|---|---|
| | | PLL$_{CLOCK}$ PWR. (mW) | PLL$_{CORE}$ PWR. (mW) | FOPAC$_{CLOCK}$ PWR. (mW) | FOPAC$_{CORE}$ PWR. (mW) | |
| AES CIPHER | 8 | 18.17 | 57.60 | 5.96 (-67.19%) | 37.87 (-34.25%) | 4 |
| CORTEX M0 | 12 | 26.04 | 73.74 | 9.34 (-64.13%) | 45.56 (-38.21) | 6 |
| VSCALE RISC-V | 16 | 41.21 | 108.28 | 12.78 (-68.98%) | 69.04 (-36.23) | 10 |
| AVERAGE | - | - | - | -67% | -36% | - |

FIG. 1.11.1

| DESIGN | RESTLE [8] ISSCC 2014 | RAHMAN [11] JSSC 2018 | THIS WORK FOPAC (SPICE) |
|---|---|---|---|
| TECHNOLOGY | 22nm SOI | 65nm BULK | 65 nm BULK |
| CLOCK SOURCE | PLL+RESONANT GRID | PLL+RESONANT GRID | ReRoC |
| SYSTEM RESONANT | ALWAYS | ALWAYS | ALWAYS |
| RESONANT DVFS | NO | YES | YES |
| VOLTAGE RANGE | 0.75-1.05 V | 0.7-1.2 V | 0.9-1.2 V |
| FREQUENCY RANGE | 2.5-5 GHz | DC-132 MHz | 348 MHz-1.1 GHz* |
| INDUCTOR | ON CHIP (0.3-2.5 nH EACH) | OFF CHIP (7nH) | NO |
| VOLTAGE REGULATOR (VR) | YES | NO | YES |
| $t_{response}$ OF VR | DNR | - | 89ps |
| $\eta_{max}$ OF VR | DNR | - | 77% |
| $\rho$ (W/mm$^2$) @ $\eta_{max}$ | DNR | - | 0.017 |
| POWER REDUCTION | 36% | 34%-38% | 25%-39% |
| CLOCK POWER REDUCTION | - | - | 62%-74% |

*DEPENDENT ON RESONANT FREQUENCY DIVIDER TOPOLOGY
DNR - DID NOT REPORT

FIG. 1.11.2

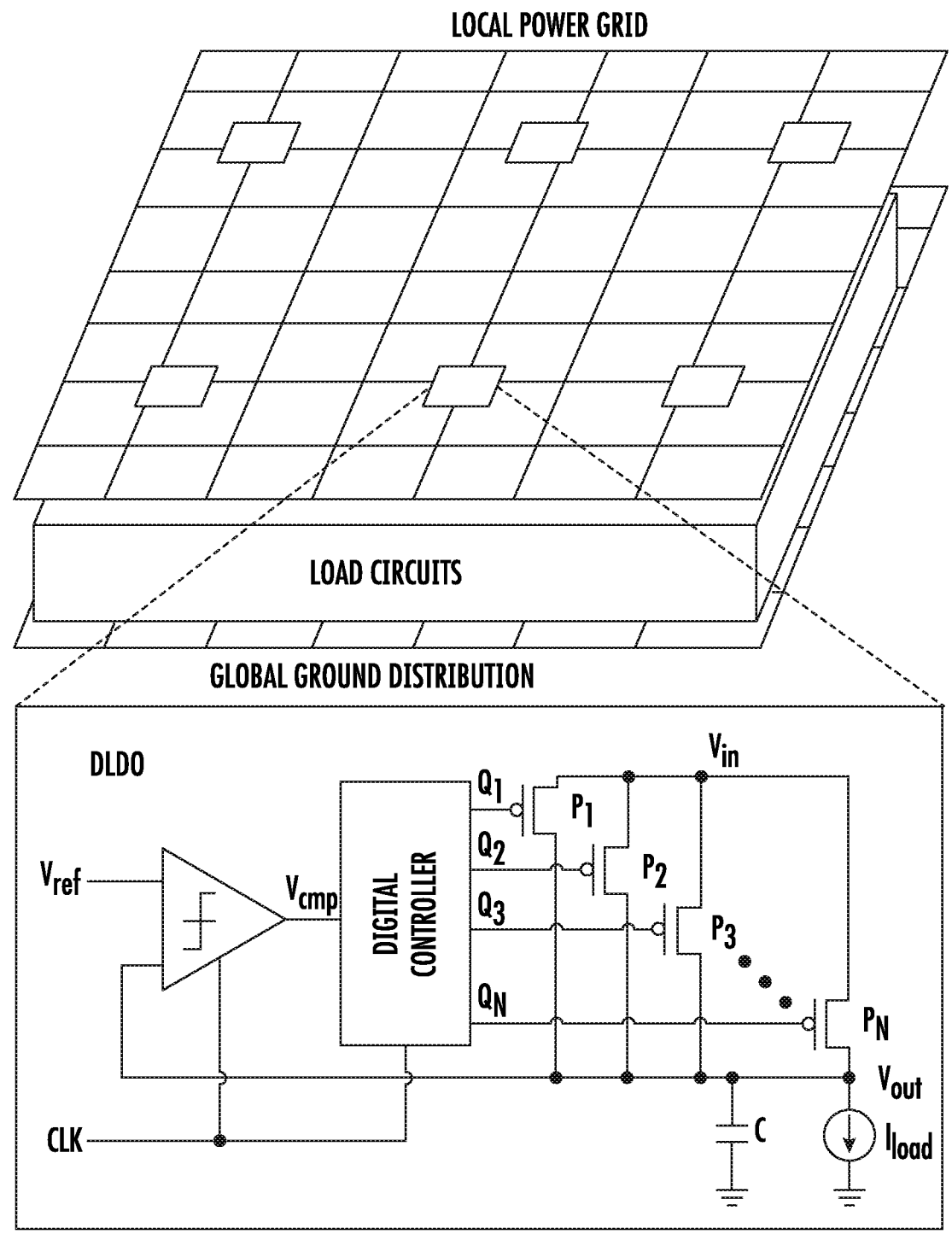
FIG. 2.1

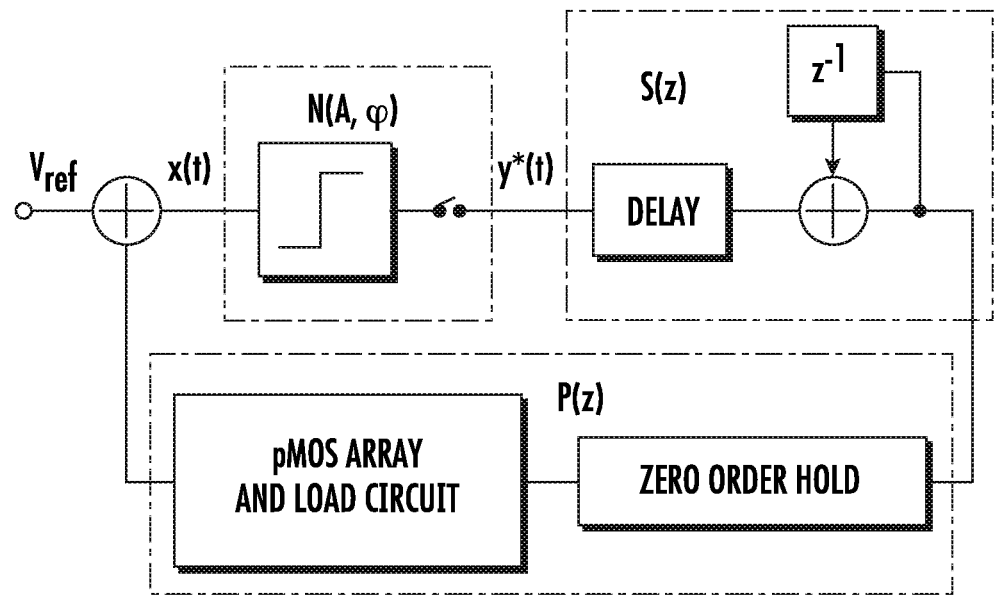
FIG. 2.2
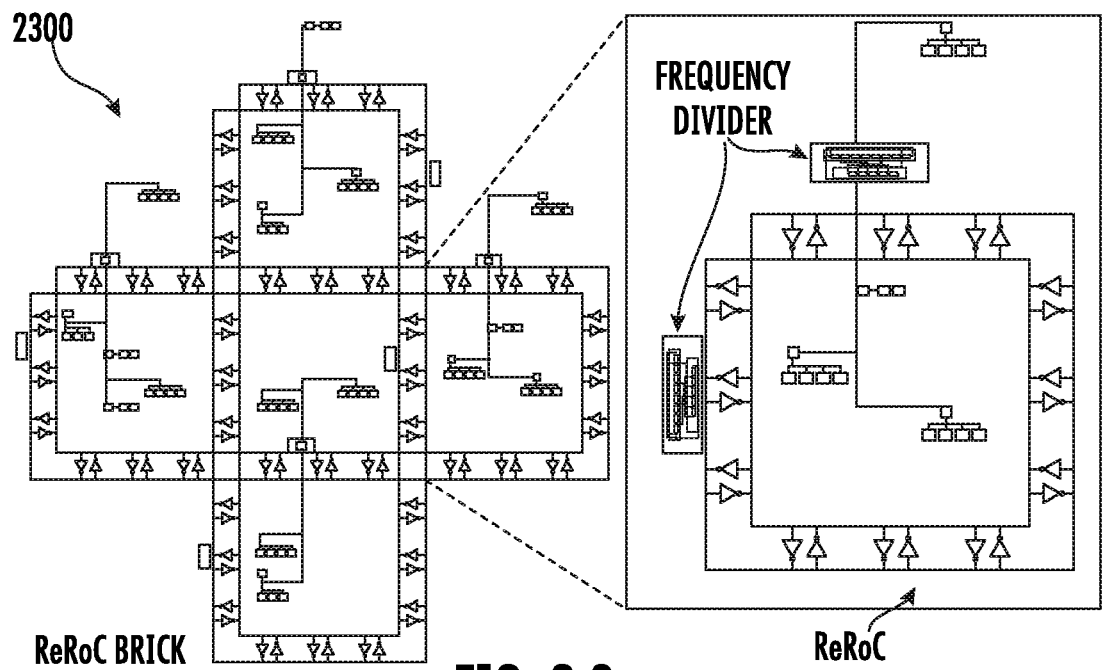
FIG. 2.3

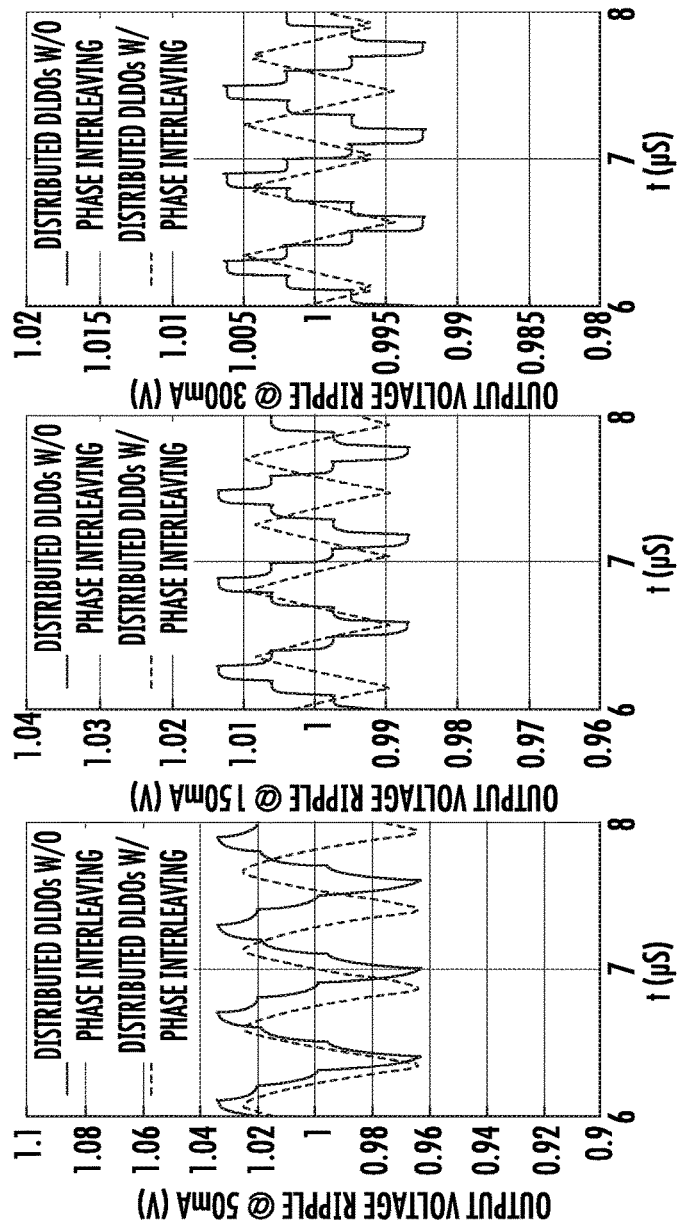
FIG. 2.4
FIG. 2.4.1

FLEXIBLE ON-CHIP POWER AND CLOCK

STATEMENT REGARDING GOVERNMENT SUPPORT

This invention was made with government support under Contract No. CCF-1350451 awarded by the National Science Foundation. The government has certain rights in the invention.

BACKGROUND

Resonant Rotary Clock Design

Resonant rotary clocks (ReRoCs) 1300 are a type of resonant clocking with constant magnitude, low power, low jitter, and multiple phases. ReRoCs are designed using integrated circuit (IC) interconnects for the transmission lines and inverter pairs 1310 that are uniformly distributed along the transmission lines in anti-parallel fashion, as illustrated in FIG. 1.3, which shows traditional circuit elements labeled as such and a detail view of one inverter pair 1310.

The ReRoC may be modeled as an LC oscillator, where the frequency is estimated by $$f_{osc} = \frac{1}{2\sqrt{L_T C_T}}.$$ EQ. 0.5

And fosc is the operating frequency of the ReRoC. The total inductance and total capacitance is given by LT and CT, respectively. Most efficient design of ReRoCs may be sparse rotary oscillator arrays (SROA), similar to a non-uniform clock mesh topology. The capacitive load and inductance affect the frequency of oscillations. SROA is correct by design through algorithmic novelties proposed in the local distribution for use in the proposed FOPAC methodology.

The improved granularity of frequency values, without the overhead of multiple local fractional PLLs, may be achieved via the use of the resonant frequency dividers. The frequency dividers 1400, as illustrated in FIG. 1.4 are designed with spot advancing blocks (SAB) and transmission gates for the multiplexers to maintain the adiabatic property of the ReRoCs. The building blocks may be the multi-input SABs (MISAB) and multi-output SABs (MO-SAB). CLK1 through CLK8 inputs of the SABs are the multiple phases readily available on each local ReRoC building block of the SROA. In particular, CLK1 is shifted by 0° from a reference, whereas CLKN is shifted by (N−1)*360/N degrees. The dynamic frequency division, with improved granularity described below is accomplished by topologically changing the connections CLK1 through CLK8.

Switched Capacitor Voltage Regulator (SCVR)

On-chip voltage regulators (OCVRs) have been widely studied in prior works making the implementation feasible in traditional CMOS processes. OCVRs can provide faster voltage scaling, reduce the number of dedicated I/O pins to the power, and facilitate fine granularity power management techniques. Switched capacitor voltage regulators (SCVR) may use fly capacitors to generate a DC output voltage. A schematic of a 2:1 SCVR 2300 may be seen illustrated in FIG. 2.3. SCVRs are designed with non-overlapping signals φ1 and φ2 that operate at the MHz frequency range. The intrinsic, switching, and conduction loses related to the fly capacitors result in lower conversion efficiency. To overcome the ripple at the output, multi-stage interleaving have been proposed, which necessitates the need for multiple phases of the clock. To generate multiple clock phases, dedicated and robust clock sources are required.

The existing resonant DVFS approaches have relatively low frequency scalability and require bulky inductors and capacitors making it challenging to achieve high energy efficiency. On-chip SCVRs have been prototyped targeting high conversion efficiency. These prior works achieve good conversion efficiencies, but require robust multi-phase non-overlapping clock signals. The generation and synchronization of the input clock signal to each multi-phase voltage regulator (MPVR) stage becomes quite costly and even unfeasible when the number of phases is very high. An earlier prototype implementation for the MPVRs used ring oscillators to generate the multi-phase clock signals. Prototype implementations of ReRoCs on silicon have also been presented to explore the energy efficiency and the multiple phases.

DLDO Background

On-Chip Power Grid and Voltage Noise Within modern integrated systems, an off-chip voltage level generated by either a battery or an off-chip voltage converter may be fed to the on-chip global power grid through VDD C4 pads. On-chip voltage regulators connect between global power grid and local power grid. Voltage level within the global power grid may be converted and regulated to another voltage level within the local power grid to serve as the supply voltage for the load circuits. On-chip local power grid with multiple distributed voltage regulators is illustrated in FIG. 2.1. On-chip local power grid and global ground distribution may be constituted by orthogonal metal lines that are connected through vias. The ground plane may be supported by the global ground distribution.

There can be distances between on-chip voltage regulators and load circuits, which lead to resistive IR noise due to resistances of the metal wires. Output voltage ripple generated by on-chip voltage regulators also propagates through the local power grid to affect on-chip voltage noise. Compared with the case of a single voltage regulator, distributed on-chip voltage regulation reduces resistive IR noise by reducing the distances between on-chip voltage regulators and load circuits.

Digital Low-Dropout Regulator Schematic of a conventional DLDO is also demonstrated in FIG. 2.1. Parallel power transistors P1 to PN controlled by a digital controller and clocked comparator provide the required load current Iload. With the aid of a digital control loop, dedicated number of power transistors is turned on to convert and regulate the input voltage Vin to a lower voltage level Vout. Vout is compared with a reference voltage Vr of at the rising edge of the clock signal clk to generate a control signal Vcmp for the digital controller. The digital controller is conventionally implemented as a bidirectional shift register to output the gate signals Q1 to QN for the power transistor array.

Due to the quantization error induced by the digital control, limit cycle oscillations occur, leading to the undesirable output voltage ripple at steady state. The mode of limit cycle oscillation indicates the number of active switching power transistors at steady state. When distributed across the chip, similar to multiphase buck or switched-capacitor converters, DLDOs with phase interleaving operation also demonstrate advantages regarding output voltage ripple reduction as is theoretically analyzed below.

SUMMARY OF THE EMBODIMENTS

Modern integrated circuits have an increasing need for various levels of both supply voltage (V) and operating frequency (f) available at fine spatial and temporal granularity. This work introduces a solution that provides a number and quality of locally distributed V/f domains through FOPAC. Opportunistically sharing design resources and features between multi-phase voltage regulators (MPVRs) and resonant rotary clocks (ReRoCs) enabling i) the scalability to hundreds of domains, ii) fast switching times for both voltage and frequency, leading to temporal flexibility, and iii) locally distributed designs, leading to spatial flexibility.

BRIEF DESCRIPTION OF THE DRAWINGS

FIG. 1.1 shows a FOPAC topology with ReRoCs and MPVRs.

FIG. 1.2 shows a fast and symmetric DVFS with FOPAC.

FIG. 1.3 shows a FOPAC circuit with the MPVR sharing the fly capacitor with the ReRoC.

FIG. 1.4 shows a Dynamic ReRoC frequency divider.

FIG. 1.5 shows the topology and power consumption of the dynamic frequency divider, from division by 3 to division by 44.

FIG. 1.5.1 shows Table 1.1, which shows dynamic frequency scaling with divider.

FIGS. 1.6(a) and (b) show an MPVR design with SCVR and integrator logic respectively.

FIG. 1.7 shows ReRoC with divider placement.

FIG. 1.8 shows MPVR symmetric step up and step down scaling, with reference voltages of 980 mV and 910 mV.

FIGS. 1.9(a) and (b) show power conversion efficiency of SCVRs and frequency scaling of ReRoC with fly caps.

FIG. 1.10 shows a FOPAC methodology.

FIG. 1.10.1 shows Table 1.2, which shows PVR, IR, and Ldi/dt analysis results.

FIGS. 1.11(a) and (b) show plots of FOPAC DVFS operation on the RISC-V core.

FIG. 1.11.1 shows Table 1.3, which shows power consumption of PLL design vs FOPAC operating at freq=825 MHz, Vdd=0.98 V, and Temp=25 C.

FIG. 1.11.2 shows Table 1.4, which shows a comparison of FOPAC vs prior works.

FIG. 2.1 shows the on-chip local power grid with distributed voltage regulators.

FIG. 2.2 shows a DLDO nonlinear sampled feedback model.

FIG. 2.3 shows ReRoC with divider placement.

FIG. 2.4 shows output voltage ripple waveforms of 6 distributed DLDOs under different load current with and without phase interleaving operation.

FIG. 2.4.1 shows Table 2.1, which shows output voltage ripple amplitudes with different number of distributed DLDOs with and without phase interleaving (PI) operation under different load current.

DETAILED DESCRIPTION OF THE EMBODIMENTS

1. Flexible On-Chip Power and Clock 1.1 Introduction

Modern integrated circuits have an increasing need for various levels of both supply voltage (V) and operating frequency (f) available at fine spatial and temporal granularity. This work introduces a solution that provides a number and quality of locally distributed V/f domains through FOPAC, as shown in FIG. 1.1. Opportunistically sharing design resources and features between multi-phase voltage regulators (MPVRs) and resonant rotary clocks (ReRoCs) enabling i) the scalability to hundreds of domains, ii) fast switching times for both voltage and frequency, leading to temporal flexibility, and iii) locally distributed designs, leading to spatial flexibility.

The performance improvements and power savings enabled by flexible on-chip power and clocks (FOPAC) are motivated in FIG. 1.2 with shaded regions. When a higher performance is needed, the voltage is scaled up (V0 to V1) followed by frequency up-scaling (f0 to f1). The speed of V/f up-scaling enables high performance node starting at time t2 as opposed to t4. Alternatively, when a lower performance is sufficient (i.e. for better energy-efficiency), the frequency is decreased followed by voltage down-scaling. Here, the speed of down-scaling enables higher amount of time to be spent in the lower performance node, initiated at time t8 as opposed to t9. Although not shown in FIG. 1.2, the granularities of the voltage V and frequency f values achievable with specific hardware implementations may also impact the energy-efficiency. Costly implementations of fractional PLLs are used to provide frequency granularity, whereas a multitude of voltage regulators and power grids are common to provide voltage granularity.

FOPAC provides spatially and temporally flexible power/clock domains that are fine-tuned for each individual unit and collectively designed with shared overhead with superior performance. This flexibility comes with significant savings in power, performance, area, and accuracy, thanks to the opportunistic design of the MPVR and the ReRoC, leading to the following features:

(1) fast switching between different V/f pairs,
(2) symmetric switching between V/f pairs to improve power savings and performance, as illustrated in FIG. 1.2,
(3) improved granularity of frequency values, without the overhead of multiple fractional PLLs distributed locally,
(4) opportunistic sharing of the fly capacitor as illustrated in FIG. 1.3, to reduce design overhead and to help scale the ReRoC frequency, and
(5) power savings of ~35% as compared to PLL based designs.

1.2. Proposed FOPAC Architecture

Flexible on-chip power and clock (FOPAC) architecture encompasses the FOPAC circuit building blocks, as illustrated in FIG. 1.3, distributed through a circuit, as illustrated in FIG. 1.1, using an ASIC-flow compliant methodology. The on-chip voltage regulators may be distributed throughout the power grid and the ReRoCs are distributed locally. The FOPAC circuitry enabling DVFS, and the FOPAC methodology to design FOPAC within a common ASIC flow are discussed in the following sections.

1.2.1 Dynamic Frequency Scaling of ReRoC

In the dynamic ReRoC frequency divider illustrated in FIG. 1.4, the phase delay between the adjacent MOSABs in the main-loop is expressed as $((m-1)/m)*2\pi$ and the phase delay between the MISABs in the sub-loop is expressed as $((m-2)/m)*2\pi$. When n1 is the number of connections between the MOSABs in the main loop, and n2 is the number of connections between the MISABs and MOSABs in the main-loop and sub-loop, then the number of connections required to perform a division of ratio r is, $$\left(n_1 * \frac{m-1}{m}\right)*2\pi + \left(n_2 * \frac{m-2}{m}\right)*2\pi = r*2\pi. \qquad \text{EQ. 1.1}$$

The m phases of the ReRoCs are used to produce the frequency divider output. When m=8, the phase delays between the adjacent SABs in the main-loop is 7/8|←−2" and the sub-loop is 6/8*2π. From Eq 1.1, to perform a frequency division of r=9, n1=6 and n2=5 connections are required. This can be achieved with the circuit topology in FIG. 1.4. However, for r=10, n1=8 and n2=4 connections would be required which is higher than the available SABs in FIG. 1.4. A modified topology is proposed in this paper in order to perform frequency division greater than 9. The main-loop in FIG. 1.4 is stacked with an additional main-loop. An increase in the number of the main-loops requires larger multiplexers to enable the selection between the main-loops and the sub-loop. Something to consider is that restricting the number of MISABs in the sub-loop is desirable for power savings and lower area. Stacking additional main-loops, any integer division ratio from 3 to n can be achieved at limited power and area cost. This is achieved by implementing the smallest number of n1 and n2 desirable for power savings and area reduction from Eq. 1.1.

The power consumption of the frequency dividers for division ratios 3 to 44 with a master clock of 3.3 GHz is shown in FIG. 1.5. The total number of MISABs and MOSABs increases monotonically along with the division ratio. The power consumption however does not increase monotonically due to the adiabatic nature of the resonant frequency dividers and the selection lines for the DFS. The switching time between frequency domains is approximately 3 clock cycles (~0.60 ns for a 5 GHz clock). Experiments are repeated for arbitrarily selected master clock frequencies of 2.5 GHz, 4.2 GHz, and 5 GHz demonstrating similar trends of sub-linearly increasing power dissipation with increasing divider value and under 3 clock cycles of switching time for DFS as shown in Table 1.1, shown in FIG. 1.5.1.

1.2.2 Dynamic Voltage Scaling With MPVR

The circuit topology for the proposed MPVR, which is an integrated SCVR with ReRoC for FOPAC, as illustrated in FIG. 1.6(*a*). MPVRs may be designed with ReRoCs that provide the multiple clock phases for the interleaved operation. The voltage ripple across the capacitor are reduced with multi-phase interleaving, and the ReRoCs provide higher granularity of phases. Some advantages in the adaptive gain comparators and the integrator logic in the feedback loop are illustrated in FIGS. 1.6(*a*) and 1.6(*b*), respectively. The comparators that provide high gain in the design are driven by a higher frequency clock signal (CLKHf) whereas the comparators that provide nominal gain by a lower frequency clock signal (CLKLf). This significantly improves the speed of the regulation at the output of the MPVR while also maintaining the stability of the control loop. The two different frequencies of the clock signal are provided from the same ReRoC, with the minimal overhead of an additional frequency divider. The comparator architecture is chosen as doubletail latch-type for speed and low kickback noise. To increase the settling speed of the integrator several integrator regions that have different step sizes based on the difference in between the output and reference voltages is designed. This technique helps the integrator to keep up with the actual current requirement at the output rather than setting it to the maximum value for fast recovery.

Overall, one ReRoC structure with k dividers can provide the k distinct clock frequencies for comparator operation, and the m multi-phase signals, shown in FIG. 1.6(*a*) for k=2 (i.e. for CLKHf and CLKLf). ReRoCs are designed in the GHz frequency range and the clock for the SCVR is generated after frequency division and duty cycle conversion.

The placement of the frequency dividers with respect to the ReRoC rings is illustrated in FIG. 1.7. It is straightforward to tap them multi-phase clock sources for the SCVRs since the tapping locations are accurately known and the routing not as complex as clock distribution networks. Consider the tapping point for a particular phase ΘPi to be located at (x,y). The SCVR clock source taps onto ΘPi that satisfies the phase requirement. The placement of the SCVR depends on: i) ΘSCVRp—the phase required for the SCVR and ii) Θli the phase attributed to the tapping wire li. The SCVR is placed such that ΘSCVRp=Θli+ΘPi.

Two sets of results are presented to validate and measure the effectiveness of the DVS operation with MPVR. The first set of results is the symmetric and fast response to both step-up and step-down changes in the reference voltage of the MPVR with an output current of 50 mA (arbitrarily selected) shown in FIG. 1.8. The high gain comparators are clocked at an arbitrarily selected ReRoC frequency of 3.3 GHz (CLKHf in FIG. 1.6(*a*)). The nominal gain comparators (CLKLf in FIG. 1.6(*a*)) and MPVRs are clocked at 360 MHz after performing frequency division by 9. It takes 89 ps and 87 ps for step-up and step-down scaling with MPVRs, respectively. The robust ReRoC signals with accurate phase matching between the SCVRs and ReRoCs along with the digital control helps in achieving the symmetric step-up and step-down scaling of the MPVRs. A maximum voltage ripple of 20 mV is achieved with 18 interleaved stages of the MPVR.

The second set of experimental results for DVS scaling with MPVR are based on the fly capacitor selection on i) SCVR conversion efficiency and ii) the opportunistic design assisting DFS. In FIG. 1.9(*a*), the voltage conversion efficiency for different fly capacitor values is shown. The overall power efficiency of the SCVR is computed as, $$\eta_{SCVR} = \frac{P_{out}}{P_{out} + P_{sw} + P_{buff} + P_{control} + P_{par}}. \qquad \text{EQ. 1.2}$$

In EQ. 1.2, Pout, Psw, Pbuff, Ppar, and Pcontrol are the output power, switching power, buffer power, parasitic power, and control and reference circuit related power, respectively. These values are obtained from SPICE simulations of extracted layouts of a FOPAC designed in a 65 nm technology. The (known) impact of the fly capacitor size on the maximum power efficiency is for varying load current is shown in FIG. 1.9(*a*). The fly capacitors can be split to achieve maximum power efficiency for varying load currents.

In the FOPAC architecture fly capacitors connected to the ReRoCs can optionally be used to lower the frequency. Frequency scaling with different fly capacitor values on an arbitrarily selected ReRoC frequency of 4.7 GHz is shown in FIG. 1.9(*b*). The fly capacitors can be split to achieve finer granularity of frequency scaling. This design parameter (and affect) of fly capacitors supplements the DFS operation provided by the resonant rotary divider (discussed above), enabling even finer control of the DFS operation in FOPAC.

1.2.3 FOPAC Methodology

The FOPAC methodology, compliant with the traditional ASIC flow, is illustrated in FIG. 1.10. First, the design is synthesized with an industrial tool and undergoes initial placement, power planning, and placement blockages for the ReRoCs. Then, the designs undergo ReRoC design and power generation. The custom flows enabling FOPAC are as follows:

1.2.3.1 ReRoC design: The custom ReRoC clock distribution network synthesis has five steps, illustrated in FIG. 1.10.

Step 1: Register clustering to generate balanced capacitance load clusters.

Step 2: BST/DME to generate an unbuffered Steiner tree for each cluster. Step 1 and step 2 constitute the subnetwork tree generation process for a bottom-up clock tree synthesis (CTS) process.

Step 3: ReRoC topology generation with the dynamic frequency dividers.

Step 4: Generation of synchronous distribution aware sparse ReRoCs (SReRoC).

Step 5: Physical connections translation to a netlist and PVT analysis of the clock distribution network. The clock network and distribution are designed to be correct by design, thanks to steps 1 through 4, concluding with the PVT analysis with SPICE-accurate verification in step 5.

1.2.3.2 Power generation: The power generation (and distribution) has five steps, illustrated in FIG. 1.10.

Step 1: Power budget estimation for the design.

Step 2: Determination of the number of SCVRs and topology.

Step 3: Placement of the MPVR.

Step 4: Power grid extraction along with the ReRoCs and core load.

Step 5: Worst case static IR and Ldi/dt analysis.

The input to Step 1 is the topology of the ReRoC rings including the number of ReRoC rings and tapping points for the multiple phases required for the MPVRs from the ReRoC design flow. For a given power budget, an SCVR topology may be designed with the goal of achieving the desired target efficiency by distributing the power budget over multiple SCVRs. The number of SCVRs required may be divided such that each ReRoC ring has a voltage regulator (with load balancing) and the rest of the design has the appropriate number of voltage regulators necessary to operate during the low performance mode. Similar to use of PVT analysis in ReRoC design for DFS, the power generation stage may use SPICE simulations in step 5 for signal integrity analysis of DVS operation.

1.3. FOPAC DVFS Evaluation

FOPAC is demonstrated on three different industrial designs that are publicly available: 1) AES encryption core, 2) Arm core—CORTEX M1, and 3) VSCALE RISC-V. The designs are placed and routed (P&R) and subjected to STA in order to verify the timing of the ASIC flow at the system level. The timing and power characteristics of the FOPAC components (ReRoC and MPVR) are analyzed in deeper detail through SPICE simulations of layout-extracted models.

In particular, the transmission line interconnect parasitics are extracted using the high frequency structural simulator (HFSS). The algorithms are implemented in C++ and Matlab. An industrial 65 nm technology library is used for the design and routing.

An arbitrary ReRoC frequency of 3.3 GHz (FM) is chosen to evaluate the FOPAC methodology. Two sets of dynamic resonant frequency dividers to perform frequency division in integer ratios 3 to 9 are designed for the core clock source (Fcore) and the MPVR clock source (Fmpvr). In the PVT stage, the geometries of the ReRoC rings along with the frequency dividers are varied ±10% to represent the worst case scenarios. The deviation from the target frequency of 3.3 GHz with PVT variations for 500 Monte-Carlo runs are presented in Table 1.2, FIG. 1.10.1. An average frequency variation of <1% and <0.6% is observed under intra- and inter-die variations, respectively.

Worst case static IR and Ldi/dt analysis are performed on the layout extracted industrial designs (RLC models). The average worst case voltage drop across the three industrial designs is 2.1% of the Vdd.

A sample operation of FOPAC DVFS operation of the RISC-V core is presented in FIG. 1.11, prior to the presentation of the performance comparisons to priorwork in literature in Tables 1.3 and 1.4, FIGS. 1.11.1 and 1.11.2 respectively. The switching speed between different frequency domains is <1 ns (~3 cycles of FM). At the start, it takes 3 ns for the ReRoC oscillations to sustain at 3.3 GHz (FM). After which a divide by 5 is performed to generate the 660 MHz clock for the core (Fcore) and divide by 9 to generate the 360 MHz clock (Fmpvr) for the MPVRs at Vdd=0.98 V (nominal).

The high gain comparators are clocked at FM and nominal gain comparators are clocked at Fmpvr. The frequency Fcore and voltage are scaled between different levels to validate the accuracy of the switching speed. To enable the fly capacitor reuse mode (RUmode), 10 of the SCVRs are shut down and the fly capacitor is loaded to the ReRoC rings in the RISC-V core. In the RUmode, it takes ~3 ns for the frequency of the ReRoC FM to stabilize to 3.14 GHz (with voltage scaling). Then, it takes 0.97 ns to scale Fcore to 624 MHz and Fmpvr to 348 MHz to operate the RISC-V core in the RUmode with Vdd=0.91 V. In total, it takes 3.97 ns to scale the frequency to the RUmode at run time by utilizing the fly capacitor of the SCVRs.

The power consumption of the FOPAC based designs versus PLL based designs operating at 825 MHz is presented in FIG. 1.11.1. The PLL-based design is built with a traditional PLL from a cell library used on the ASIC implementations performed with Cadence Innovus. Power measurements are presented for the PLL only, labeled PLLclock, and for the entire design, labeled PLLcore. The power of the SCVRs, the frequency dividers, and the control circuit is included in FOPACcore. The PLL based designs and FOPAC based designs have the same number of SCVRs. The clock source for the SCVRs in the PLL based designs are ring oscillators. A total power saving of 36% is achieved for the circuits (FOPACcore) when compared against a PLL clocked core (PLLcore). The clock power savings are significant for the clocks: 67% power savings (FOPACclock) when compared against a PLL based design (PLLclock).

FOPAC is compared to prior resonant works in Table 1.4. The numbers reported in Table 1.4 are from SPICE simulations of the sweep of the V/f range—0.9 to 1.2V and 348 MHz to 1.1 GHz—over SS, FF, FS, and SF corners, and not only the results reported in Table 3. Overall, FOPAC delivers power with 77% efficiency, and achieves 25%-39% power reduction thanks to 64%-74% reduction in clock power.

The voltage scaling within FOPAC is symmetric and robust with a (worst-case) tresponse of 89 ps. The DFS switching time within FOPAC utilizing a 3.3 GHz ReRoC is 0.9 ns. Overall, FOPAC demonstrates scaling of the voltage-frequency over a wide range without the need for on/off-chip inductors while re-utilizing (RUmode) the fly capacitor for higher frequency tuning.

1.4 Conclusions

In this paper, the fusion of resonant rotary clock with on chip voltage regulators enabling flexible on-chip power and clock is presented. FOPAC is designed and evaluated on three different industrial designs to validate the architecture. FOPAC can switch between different V/f domains in 1.9 ns with a ReRoC clock operating at 3.3 GHz. FOPAC achieves 25%-39% power savings while offering fly capacitance re-usability to tune the ReRoC frequency at run time without any negative implications. FOPAC can provide high number of V/f domains with fast DVFS capability while consuming low-power and operating reliably, justified via evaluation on industrial designs in this work.

2. Distributed Digital Low-Dropout Regulators With Phase Interleaving For On-Chip Voltage Noise Mitigation 2.1 Introduction Digital low-dropout regulator (DLDO) where multiple parallel power transistors are controlled by a digital loop consisting of a shift register and a clocked comparator has been drawing attention in modern integrated systems such as processors and Internet of Things (IoT) applications. Due to the adoption of a digital control loop, low design complexity, low voltage operation capability, and process scalability can be easily achieved. Various techniques such as adaptive control and reduced dynamic stability, coarse-fine-tuning and burst-mode operation, event-driven PI control, and computationally control have been implemented to improve the transient response. Meanwhile, reliability enhancement techniques for DLDOs have also been investigated recently.

On the other hand, on-chip power delivery network becomes larger and more sophisticated with technology scaling to support increased functionality of the load circuits. Distributed on-chip voltage regulation with multiple tiny voltage regulators deployed at different locations of the chip emerges as a promising solution to achieve localized voltage regulation and superb voltage noise performance. With increased number of voltage regulators distributed across the chip, load current is supplied by nearby voltage regulators and therefore less IR drop can be realized as compared with a centralized power delivery scheme utilizing a single voltage regulator.

DLDO is an ideal candidate for distributed on-chip voltage regulation due to the aforementioned advantages. Similar to a multiphase buck or switched-capacitor converter, the clock distribution network of distributed DLDOs also needs to be carefully considered.

Despite the advantages of DLDOs, limit cycle oscillation due to inherent quantization error can occur, which leads to unwanted output voltage ripple at steady state. In this work, the benefits of distributed DLDOs with phase interleaving are investigated both theoretically and through extensive simulations regarding on-chip voltage noise mitigation under different number of DLDOs. Design issue of the corresponding clock distribution network is also addressed. Instead of utilizing a ring oscillator, resonant rotary clock (ReRoC) is proposed for robust clock generation and distribution.

3 Distributed Digital Low-Dropout Regulators With Phase Interleaving

The amplitude and mode of limit cycle oscillation can be investigated utilizing a nonlinear sampled feedback model for DLDO steady state operation shown in FIG. 2.2. $N(A,\varphi)$, $S(z)$, and $P(z)$ represent, respectively, the describing function of the clocked comparator, transfer function of the shift register together with the delay between the shift register and clocked comparator, and transfer function of the power transistor array together with the load circuit and the function of zero order hold. A and $\varphi$ denote, respectively, the amplitude of limit cycle oscillation and the phase shift of x(t). $N(A,\varphi)$, $S(z)$, and $P(z)$ can be, respectively, expressed as [4, 14, 22]

$$N(A, \varphi) = \frac{2D}{MTA} \sum_{m=0}^{M-1} \sin\left(\frac{\pi}{2M} + \frac{m\pi}{M}\right) \angle \left(\frac{\pi}{2M} - \varphi\right). \quad \text{EQ. 2.1}$$

$$S(z) = z^{-1} \cdot \frac{z}{z-1} = \frac{1}{z-1}, \quad \text{EQ. 2.2}$$

$$P(z) = K_{OUT} \frac{1 - e^{-F_l T}}{F_l(z - e^{-F_l T})} \quad \text{EQ. 2.3}$$

where T, D, M, Fl, and KOUT are the clock period, amplitude of the clocked comparator output, mode of limit cycle oscillation, load pole, and gain of $P(z)$, respectively. KOUT=KDCIpMOS and Fl=1/(RL∥Rp)C. KDC, IpMOS, RL, Rp, and C are DC constant, current provided by a single power transistor, load resistance, power transistor array resistance, and output capacitance, respectively.

The following Nyquist condition needs to be satisfied for a certain mode of limit cycle oscillation to exist $$N(A,\varphi)P(e^{j\omega T})S(e^{j\omega T})=1\angle(-\pi) \quad \text{EQ. 2.4}$$

where the angular limit cycle oscillation frequency ω=π/TM. Determined by (4), $$\varphi = \frac{\pi}{2} - \frac{\pi}{2M} - \tan^{-1}\left(\frac{\pi}{MTF_l}\right),$$

$$\varphi \in (0, \pi/M). \quad \text{EQ. 5}$$

Considering distributed on-chip voltage regulation with N DLDOs, under a certain load current condition Iload, if all N DLDOs operate with the same clock signal, the equivalent IpMOS becomes NIpMOS as N power transistors are turned on/off at the rising edge of each clock cycle. Fl and T remain unchanged as compared with the case of a single DLDO. For this case, $\varphi$ becomes $$\varphi_1 = \frac{\pi}{2} - \frac{\pi}{2M_1} - \tan^{-1}\left(\frac{\pi}{M_1 TF_l}\right),$$

$$\varphi_1 \in (0, \pi/M_1). \quad \text{EQ. 2.6}$$

When N distributed DLDOs operate in a phase-interleaved fashion, Fl and IpMOS remain unchanged while the equivalent T becomes T/N. Therefore, the corresponding $\varphi$ becomes $$\varphi_2 = \frac{\pi}{2} - \frac{\pi}{2M_2} - \tan^{-1}\left(\frac{N\pi}{M_2 TF_l}\right),$$

$$\varphi_2 \in (0, \pi/M_2). \quad \text{EQ. 2.7}$$

Compared with $\varphi1$, $\varphi2$ is more likely to satisfy the condition of $\varphi \in (0,\pi/M)$ with a larger value of M due to the added factor N, which means a larger limit cycle oscillation mode. However, the amplitude of output voltage ripple demonstrates an approximately linear relationship with the equivalent size of a single power transistor while is less affected by the equivalent switching frequency. A smaller output voltage ripple is therefore typically introduced with phase interleaved clocks.

2.3 Clock Generation and Distribution

ReRoC is proposed to serve as the clock circuitry 2300 for distributed DLDOs as shown in FIG. 2.3. ReRoC is a type of resonant clocking with constant magnitude, low power, low jitter, and multiple phases. ReRoCs are designed using IC interconnects for the transmission lines and inverter pairs that are uniformly distributed along the transmission lines in anti-parallel fashion. The traveling wave along the transmission line of an ReRoC provides multiple phases with a duty cycle of 50%. The phase delay of the ReRoC is evenly distributed in the direction of wave propagation. The relationship between the time delay and phase delay is expressed as, $$\theta/2\pi = t/T.$$ EQ. 2.8

T is the clock period in Eq. 2.8. A power optimal solution can be generated by designing GHz frequency range ReRoCs and then performing frequency division to generate the target frequency. The resonant frequency divider is designed with the spot-advancing blocks (SABs) to perform frequency division. Multiple SABs along with them phases of the ReRoC are utilized to perform frequency division. Cascading multiple SABs together the desired frequency division ratio can be achieved. Each SAB block in the divider topology phase shifts the clock signal by $((m-1)/m) \cdot 2\pi$. Therefore, each SAB block employed for the frequency division generates a phase shifted signal. The same phase clock signals can be tapped from the first SAB block of each divider topology. Overall, one ReRoC structure with k dividers can provide the k distinct clock frequencies for comparator operation, and the multi-phase signals. ReRoCs are designed in the GHz frequency range and the clock for the multi-phase distributed DLDOs is generated after frequency division and duty cycle conversion.

It is straightforward to tap them multi-phase clock sources for the distributed DLDOs since the tapping locations are accurately known on the frequency divider, and the routing not as complex as clock distribution networks accomplished in earlier approaches. Consider the tapping point for a particular phase $\Theta P_i$ to be located at (x,y). The distributed DLDOs clock source taps onto $\Theta P_i$ that satisfies the phase requirement. The clock phase depends on: i) $\Theta DLDO_p$—the phase required for the DLDO, and ii) $\Theta l_i$ the phase attributed to the tapping wire $l_i$, where $\eta DLDO_p = \Theta l_i + \Theta P_i$. ReRoC can be designed to fit the locations of DLDOs or vice versa.

ReRoCs, through self-resonance and being locked in-phase across ReRoC rings in an ReRoC oscillatory array (ROA) topology, are robust to local variations through self-tuning. In other words, a local variation affecting a local ReRoC ring gets compensated across the ROA, as each local ReRoC ring is locked in phase, and will quickly recover back to the stable resonance mode (or stabilize at a new resonance mode). This structure provides for robustness to variations and limits jitter and skew variations. The self-resonance, on the other hand, requires algorithmic solutions to balance the load across the ROA. The ReRoCs are known to be stable under process variations in terms of frequency matching across large floorplans.

2.4 Evaluation

To validate the effectiveness of distributed DLDOs with phase interleaving operation, DLDOs with a supply voltage of 1.1V, which is typical for processor applications, are implemented using a 32 nm CMOS process. Output voltage level of 1V is considered. Resistive mesh model is used for the power grid with model parameters. Current provided by a single power transistor IpMOS is approximately 2 mA. 10 MHz clock frequency is utilized for steady state operation. Distributed on-chip voltage regulation with, respectively, 3, 6, and 9 DLDOs is considered. A single DLDO in each case has, respectively, 96, 48, and 32 power transistors such that the total maximum current capability for each case is the same. Uniform distribution of DLDOs is considered. Load currents of 50 mA, 150 mA, and 300 mA are considered for each case. Simulation results demonstrating the output voltage ripple waveforms of 6 distributed DLDOs under different load current with and without phase interleaving operation are shown in FIG. 2.4. Output voltage ripple amplitudes with different number of distributed DLDOs with and without phase interleaving operation under different load current are summarized in Table 2.1 shown in FIG. 2.4.1. Seen from FIG. 2.4 and Table 2.1, distributed DLDOs with phase interleaving demonstrate advantages with different number of DLDOs and under different load current conditions. With a fixed number of DLDOs, output voltage ripple amplitude increases as load current increases for both cases with and without phase interleaving operation. Under a certain load current, output voltage ripple increases with increased number of DLDOs. Distributed DLDOs with phase interleaving operation are also always beneficial regarding on-chip voltage noise mitigation.

Under a load current of 50 mA and 9 DLDOs, phase interleaving operation reduces voltage ripple from 179.41 mV to 97.42 mV, which is within 10% of Vout. Furthermore, up to 46% output voltage ripple reduction is demonstrated.

2.5 Conclusions

Distributed on-chip voltage regulation demonstrates advantages as compared with a centralized scheme with only a single voltage regulator. DLDO is an ideal candidate for distributed on-chip voltage regulation. When distributed, the clock generation and distribution need to be carefully considered. It is investigated in this work through both theoretical analysis and extensive simulations that distributed DLDOs with phase interleaving operation helps to mitigate on-chip voltage noise at steady state. Corresponding clock circuitry leveraging resonant rotary clock, which is highly resilient to process variation, is also proposed. Distributed DLDOs with phase interleaving operation demonstrate up to 46% on-chip voltage noise mitigation.

While the invention has been described with reference to the embodiments above, a person of ordinary skill in the art would understand that various changes or modifications may be made thereto without departing from the scope of the claims.

We claim:

1. A flexible on-chip power and clock (FOPAC) architecture comprising:
    multi-phase voltage regulators (MVPRs) that share a fly capacitor with a resonant rotary clock (ReRoC),
    wherein the ReRoC provides multiple clock phases for an interleaved operation; and
    wherein comparators provide that high gain are driven by a higher frequency clock signal (CLKHf) and comparators that provide nominal gain by a lower frequency clock signal (CLKLf).

2. The flexible on-chip power and clock (FOPAC) architecture of claim 1, wherein the ReRoC includes IC interconnects for transmission lines.

3. The flexible on-chip power and clock (FOPAC) architecture of claim 2, further comprising inverter pairs that are uniformly distributed along the transmission lines.

4. The flexible on-chip power and clock (FOPAC) architecture of claim 3, wherein the inverter pairs are uniformly distributed along the transmission lines in anti-parallel fashion.

5. The flexible on-chip power and clock (FOPAC) architecture of claim 4, wherein a traveling wave along the transmission line of the ReRoC provides multiple phases with a duty cycle of 50%.

6. The flexible on-chip power and clock (FOPAC) architecture of claim 5, wherein the phase delay of the ReRoC is evenly distributed in the direction of wave propagation.

7. The flexible on-chip power and clock (FOPAC) architecture of claim 1, wherein the two different frequencies of the clock signals are provided from the ReRoC.

8. The flexible on-chip power and clock (FOPAC) architecture of claim 1, wherein the comparators are a doubletail latch-type for speed and low kickback noise.

9. The flexible on-chip power and clock (FOPAC) architecture of claim 1, wherein the MVPR is an integrated switched capacitor voltage regulator (SCVR).

10. The flexible on-chip power and clock (FOPAC) architecture of claim 9, wherein the SCVR comprises at least one fly capacitor that generates a DC output voltage.

11. The flexible on-chip power and clock (FOPAC) architecture of claim 9, wherein the SCVR has non-overlapping signals that operate at the MHz frequency range.

12. The flexible on-chip power and clock (FOPAC) architecture of claim 1, wherein the ReRoC comprises a frequency divider with a main loop of MOSABs and a sub-loop of MISABs.

* * * * *